(12) United States Patent
Lin

(10) Patent No.: US 9,264,036 B2
(45) Date of Patent: Feb. 16, 2016

(54) METHOD OF TRANSMITTING SIGNALS

(71) Applicants: HEP TECH CO., LTD., Taichung (TW); Ming-Feng Lin, Taichung (TW)

(72) Inventor: Ming-Feng Lin, Taichung (TW)

(73) Assignees: HEP TECH CO., LTD., Taichung (TW); Ming-Feng Lin, Taichung (TW)

( * ) Notice: Subject to any disclaimer, the term of this patent is extended or adjusted under 35 U.S.C. 154(b) by 0 days.

(21) Appl. No.: 14/224,392

(22) Filed: Mar. 25, 2014

(65) Prior Publication Data

US 2014/0312807 A1  Oct. 23, 2014

(30) Foreign Application Priority Data

Apr. 19, 2013 (TW) ............... 102114012 A

(51) Int. Cl.
*H05B 37/02* (2006.01)
*H03K 17/94* (2006.01)
*H05B 33/08* (2006.01)

(52) U.S. Cl.
CPC ............ *H03K 17/94* (2013.01); *H05B 37/0263* (2013.01); *H05B 33/0815* (2013.01); *Y10T 307/858* (2015.04)

(58) Field of Classification Search
CPC ........... H05B 33/0815; H05B 33/0851; H05B 33/0845; H05B 37/0263; H05B 33/0803; H05B 33/0809; H05B 39/048
USPC ................................ 315/307, 291, 287, 200 R
See application file for complete search history.

(56) References Cited

U.S. PATENT DOCUMENTS

| | | | | |
|---|---|---|---|---|
| 2009/0243582 A1* | 10/2009 | Irissou et al. | ................. | 323/320 |
| 2011/0043121 A1* | 2/2011 | Matsuda et al. | ............... | 315/224 |
| 2011/0291583 A1* | 12/2011 | Shen | ............................ | 315/287 |
| 2012/0206943 A1* | 8/2012 | Sagneri et al. | ............. | 363/21.02 |
| 2012/0249012 A1* | 10/2012 | Xu | ................................ | 315/291 |
| 2013/0181624 A1* | 7/2013 | Kang | ........................ | 315/200 R |
| 2013/0343095 A1* | 12/2013 | Zhu et al. | .................... | 363/21.01 |
| 2014/0265898 A1* | 9/2014 | Del Carmen et al. | ..... | 315/200 R |

* cited by examiner

*Primary Examiner* — Douglas W Owens
*Assistant Examiner* — Syed M Kaiser
(74) *Attorney, Agent, or Firm* — WPAT, PC; Justin King

(57) ABSTRACT

A method of transmitting signals applied for a loading control system, which includes a phase angle control module and a driving module, wherein the phase angle control module is electrically connected to an input interface. The method includes the following steps: A. switch the input interface from a first status to a second status; B. modify a voltage waveform of an AC power to make the voltage waveform have a delayed conduction angle in half of its wave period; C. check the delayed conduction angle of the voltage waveform; D. transmitting an electric signal to a loading according to the delayed conduction angle.

18 Claims, 10 Drawing Sheets

METHOD OF TRANSMITTING SIGNALS

The current application claims a foreign priority to the patent application of Taiwan No. 102114012 filed on Apr. 19, 2013.

BACKGROUND OF THE INVENTION

1. Technical Field

The present invention relates generally to signal transmission, and more particularly to a method of transmitting signals by means of voltage waveforms.

2. Description of Related Art

Typically, indoor electricity wiring is installed by providing two wires between an electricity box on the ceiling and another electricity box in the wall, wherein the two wires are connected to a switch. To install an electric apparatus (such as a lamp, an electric fan, or other loadings), the electric apparatus is fixed on the ceiling and connected to an end of mains electricity, while the other end of mains electricity is connected to a switch through the wires, and connected back to the electric apparatus to form a power loop. In this way, the electric apparatus can be turned on and off simply by switching the switch.

Because of the advancement of technology, electric apparatuses nowadays provide various functions. For example, the luminance and light color of a commonly seen LED (light-emitting diode) illumination system are usually adjustable now. In order to transmit control signals which are related in performing such functions, the LED illumination system may need additional control wiring other than the power loop to transmit the control signals from, say, a control panel on the wall to a LED module.

In other words, additional control wiring seems necessary for LED illumination systems which have functions of adjusting luminance and light color, because control signals may have to be transmitted through control wiring to a LED module. However, additional control wiring inevitably increases the cost for home maintenance or home decoration.

There are two conventional ways to transmit control signals without installing additional control wiring, which are by means of wireless transmission and carrier transmission. The wireless way requires wireless transceivers respectively installed at the LED module and the control panel on the wall, and the control signals for controlling the LED module can be transmitted wirelessly. As to the carrier way, there has to be a modulator to convert control signals into frequency-modulated signals or amplitude-modulated signals, and the converted signals are carried through power line. The LED module can be controlled after the converted signals being recovered with a demodulator.

Either way requires expensive equipment, and wireless transceivers and modulators still need additional power wiring too, which is kind of bothersome. Furthermore, signals transmitted by means of wireless transmission or carrier transmission tend to be interfered by other wireless signals, and it even creates more trouble to comply with EMI and EMS regulations of different countries.

BRIEF SUMMARY OF THE INVENTION

In view of the above, the primary objective of the present invention is to provide a method of transmitting signals, which can transmit signals with the wiring of a conventional power loop.

The method of transmitting signals of the present invention is applied for a loading control system, wherein the loading control system includes a phase angle control module and a driving module electrically connected to each other; the phase angle control module is electrically connected to an AC power and an input interface, and the driving module is electrically connected to a loading; the method includes the following steps: A. switch the input interface from a first status to a second status; B. activate the phase angle control module to modify a voltage waveform of the AC power to make the voltage waveform have a delayed conduction angle in half of its wave periods; C. check the delayed conduction angle of the voltage waveform; and D. transmit an electric signal to the loading from the driving module according to the delayed conduction angle.

Whereby, the method of transmitting signals is able to transmit signals with the wiring of a conventional power loop. Therefore, it is not necessary to install additional control wiring, and the cost of wiring is reduced as a result.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

The details of the method of transmitting signals of the present invention are explained with a LED illumination system, which is used as a loading control system.

Figure 1:
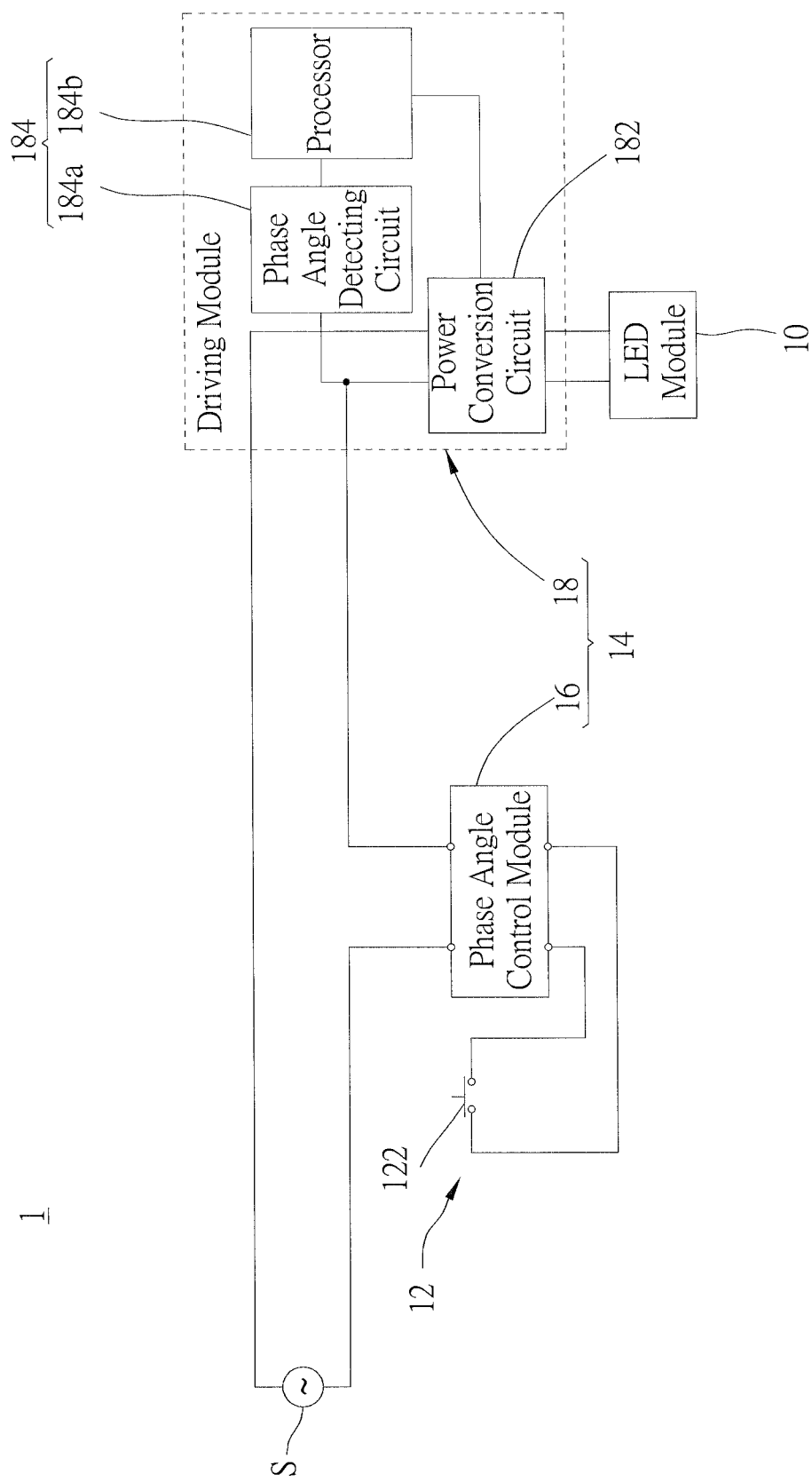
FIG. 1 is a block diagram of the illumination system of a first preferred embodiment of the present invention.

As shown in FIG. 1, a LED illumination system 1 of the first preferred embodiment of the present invention includes a LED module 10, an input interface 12, and a phase signal transmitter 14, wherein the LED module 10 could be replaced with other loadings in other embodiments.

The LED module 10 has a plurality of LEDs, which receive electric signals to emit light and provide illumination. The input interface 12 includes a switch 122, wherein the switch 122 is a normally open push switch. In the first preferred embodiment, the switch 122 is activated by being pressed, and while being pressed, it is short. The input interface 12 is at a first status under normal condition, and is at a second status when the switch 122 is short.

Figure 10:
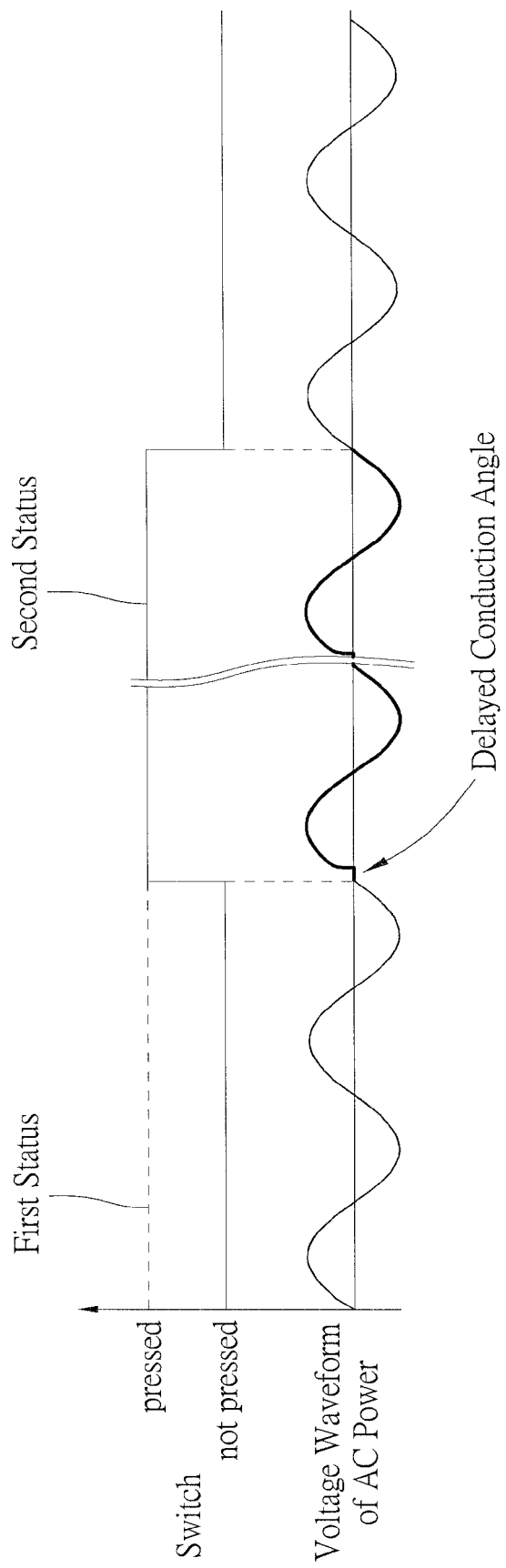
FIG. 10 is a schematic view, showing that the waveform of the AC power has a delayed conduction angle in every positive half wave while the switch is being pressed.

The phase signal transmitter 14 includes a phase angle control module 16 and a driving module 18, wherein the phase angle control module 16 is electrically connected to an AC power S and the switch 122, and the phase angle control module 16 detects whether the switch 122 is at the first or the second status. As shown in FIG. 10, when the switch 122 is pressed and therefore conducted (i.e. the input interface 12 is switched to the second status), the phase angle control module 16 modifies a voltage waveform of the AC power S to make the voltage waveform have a delayed conduction angle in its positive half wave periods. In contrast, once the switch 122 is not pressed, the input interface 12 automatically returns back to the first status, and the voltage waveform is no longer being modified by the phase angle control module 16. In other words, the voltage waveform has no delayed conduction angle therein. In order to reduce harmonic of the AC power S and not to lower power factor too much, a degree of the delayed conduction angle is preferable to be no greater than 90 degrees.

The driving module 18 includes a power conversion circuit 182 and a control unit 184 which are electrically connected to each other. The power conversion circuit 182 is electrically connected to the phase angle control module 16 and the LED module 10, to receive electric power flowing through the phase angle control module 16 and convert it into the electric signals which meet the requirement of the LED module 10. The power conversion circuit 182 is controllable to switch the LED module 10 between on/off statuses, and to change its luminance. In the first preferred embodiment, the design of the power conversion circuit 182 is based on a pulse width modulation circuit, and therefore the power conversion circuit 182 can modify a clocking of the electric signals provided to the LED module 10 by modulating pulse width. Of course, the power conversion circuit 182 can be designed to have the function of modifying intensity of the electric signals in practice.

The control unit 184 includes a phase angle detecting circuit 184a and a processor 184b. The phase angle detecting circuit 184a is electrically connected to the phase angle control module 16 to detect if the voltage waveform contains the delayed conduction angle, and measure the degree of the delayed conduction angle if so. The result of such detection is transmitted to the processor 184b, which is built-in with a plurality of control modes. The control modes include a maximum illumination mode, a default illumination mode, and a luminance adjusting mode. One of the control modes is selected to control the electric signals provided by the power conversion circuit 182 to drive the LED module 10 to emit light. The result of detecting the delayed conduction angle with the phase angle detecting circuit 184a is a basis for determining which status the input interface 12 is at.

In more details, the maximum illumination mode controls the power conversion circuit 182 to drive the LED module 10 to emit light with a maximum luminance value under a rated power.

The default illumination mode controls the power conversion circuit 182 to drive the LED module 10 to emit light with a default luminance value. In the first preferred embodiment, the default luminance value is half of the maximum luminance value by default, and can be modified in the luminance adjusting mode.

The luminance adjusting mode controls the power conversion circuit 182 to drive the LED module 10 emit light with a luminance value which keeps changing from a first luminance value to a second luminance value repeatedly, until the processor 184b finds out that the status of the input interface 12 is changed. The luminance value of this time point is recorded to replace the default luminance value of the default illumination mode, and the LED module 10 is driven to emit light with the newly recorded default luminance value. In the first preferred embodiment, the first luminance value is the maximum luminance value, and the second luminance is a minimum luminance value that the LED module 10 could provide.

Since the voltage waveform has the delayed conduction angle in each wave period after passing through the phase angle control module 16 while the switch 122 is being pressed, the processor 184b can calculate a length of time in which the switch 122 is being pressed by counting the number of the wave periods that has the delayed conduction angle in the voltage waveform, and the control modes of the processor 184b can be switched according to such information.

When the AC power S is just conducted, and the switch is not yet to be pressed (i.e. the input interface 12 is at the first status), the phase angle control module 16 doesn't change the voltage waveform of the AC power S, and therefore the phase angle detecting circuit 184a detects no delayed conduction angle in the voltage waveform. Meanwhile, the processor 184b controls the power conversion circuit 182 not to provide the electric signals to the LED module 10 to turn it off.

After the switch 122 is being pressed, the phase angle detecting circuit 184a detects that the voltage waveform has the delayed conduction angle, and the processor 184b calculates the length of time that the switch 122 is being pressed with the aforementioned method to switch between the control modes accordingly.

If the length of time is shorter than a predetermined length of time, which is 1.2 seconds in the first preferred embodiment, the processor 184b is switched to the maximum illumination mode, and therefore the LED module 10 emits light with the maximum luminance value.

If the switch 122 is pressed again, and the length of time for this time is still shorter than the predetermined length of time, the processor 184b is switched to the default illumination mode, and therefore the LED module emit light with the default luminance value.

If the switch 122 is pressed yet again, and the length of time for this time is still shorter than the predetermined length of time, the processor 184b controls the power conversion circuit 182 not to provide the electric signals to the LED module 10, and therefore the LED module 10 is turned off.

If the default luminance value needs to be modified, a user has to press the switch 122 for a while to let the length of time longer than the predetermined length of time. In such case, the processor 184b is switched to the luminance adjusting mode, which allows the user to modify the default luminance value.

With the aforementioned design, when the LED illumination system 1 is applied to a building, the switch 122 and the phase angle control module 16 could be installed on walls of the building (i.e. installed at a control end), and the driving module 18 and the LED module 10 could be installed on the walls of a ceiling of the building (i.e. installed at a loading end). As a result, the phase angle control module 16 and the driving module 18 only need two wires, which are connected to the AC power S, to connect each other. In other words, the driving module 18 is informed with the status of the input interface 12 by means of the voltage waveform which passes through the original wiring of the building, and therefore the driving module 18 is able to transmit corresponding electric signals to control the LED module 10.

In practice, the LED module 10 could include a plurality of first LEDs and a plurality of second LEDs, wherein the light color of the first LEDs is different from that of the second LED. For example, the light color of the first LEDs is one of the cool colors, such as white or blue, and the light color of the second LEDs is one of the warm colors, such as yellow or red.

The power conversion circuit 182 of the riving module 18 respectively controls a luminance ratio of the first LEDs and the second LEDs, wherein the luminance ratio of the first LEDs is the ratio between a luminance value provided by the first LEDs and the maximum luminance value or the default luminance value, and the luminance ratio of the second LEDs is similar. The light color of the LED module 10 can be modified with different luminance ratios of the first LEDs and the second LEDs.

The processor 184*b* keeps a first luminance ratio information and a second luminance ratio information, wherein the first luminance ratio information and the second luminance ratio information respectively specify the luminance ratios of the first LEDs and the second LEDs under the maximum illumination mode and the default illumination mode.

The control modes of the processor 184*b* further includes a light color adjusting mode, which allows the first and the second luminance ratios to be adjusted. When the processor 184*b* is operated under the maximum illumination mode or the default illumination mode, if the user presses the switch 122 longer than another predetermined length of time, which is 4 seconds in the first preferred embodiment, the processor 184*b* is switched to the light color adjusting mode.

Under the light color adjusting mode, the processor 184*b* controls the power conversion circuit 182 to drive the LED module 10 to emit light with a fixed luminance value (i.e. the maximum luminance value or the default luminance value), and to tune the luminance ratios of the first and the second LEDs of the LED module 10 repeatedly, until the processor 184*b* finds out that the status of the input interface 12 is changed. The luminance ratios of the first and the second LEDs of this time point are recorded to replace the first luminance ratio information under the maximum illumination mode or the second luminance ratio information under the default illumination mode, and the first and second LEDs are driven to emit light with the newly recorded luminance ratios.

Whereby, the user is able to switch between the control modes and adjust the luminance or the light color by simply pressing the switch 122 for a certain length of time.

Figure 2:
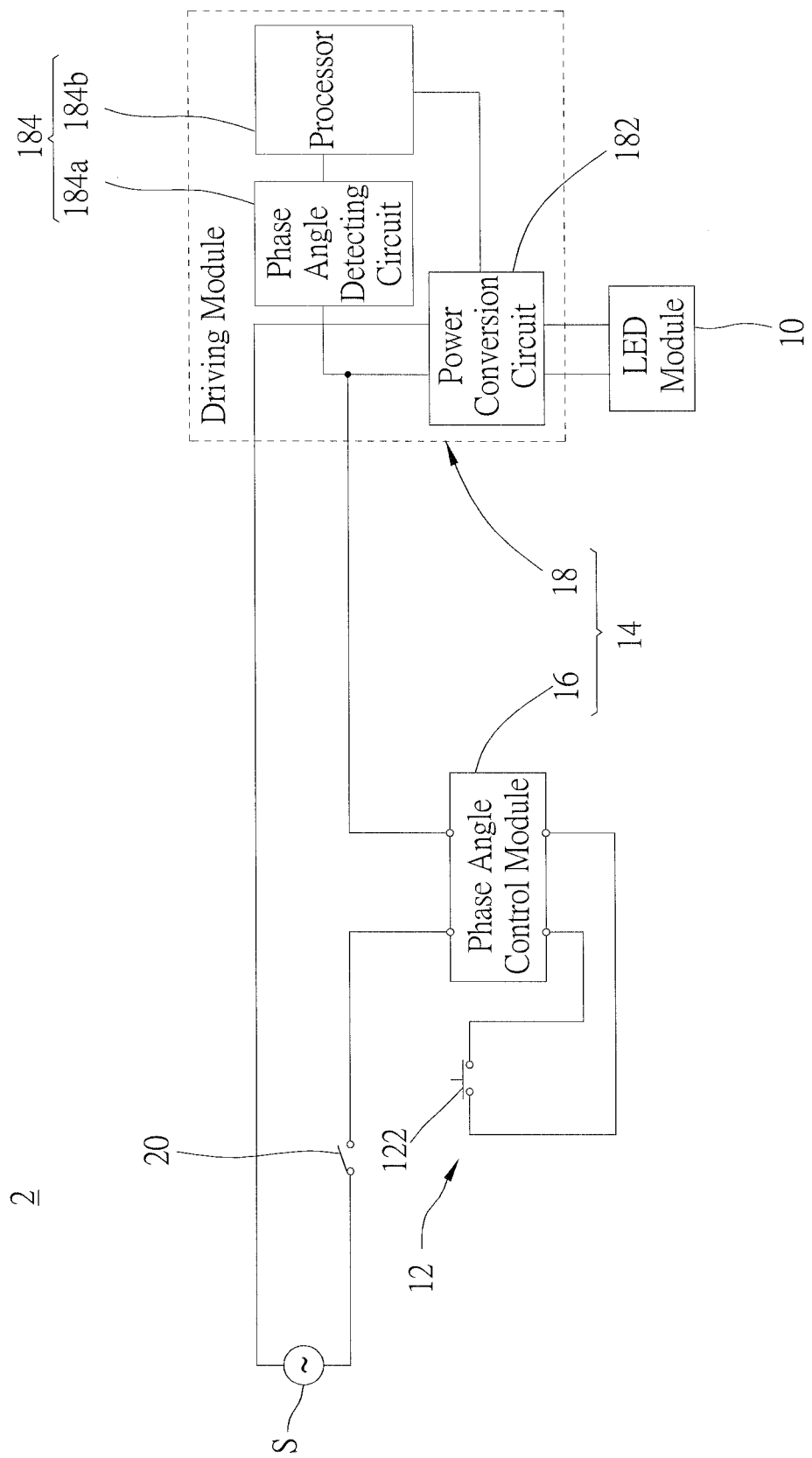
FIG. 2 is a block diagram of the illumination system of a second preferred embodiment of the present invention.

As shown in FIG. 2, a LED illumination system 2 of the second preferred embodiment of the present invention is based on the first preferred embodiment, but further has a change-over switch 20, which is electrically connected to the AC power S and the phase angle control module 16. The change-over switch 20 is provided to turn on or off the LED module 10.

In the second preferred embodiment, when the change-over switch 20 is conducted, the processor 184*b* of the driving module 18 is operated under the maximum illumination mode, and therefore the LED module 10 emit light with the maximum luminance value. Similarly, by pressing the switch 122 longer or shorter, the processor 184*b* can be switched between the default illumination mode, the maximum illumination mode, the luminance adjusting mode, and the light color adjusting mode.

Figure 3:
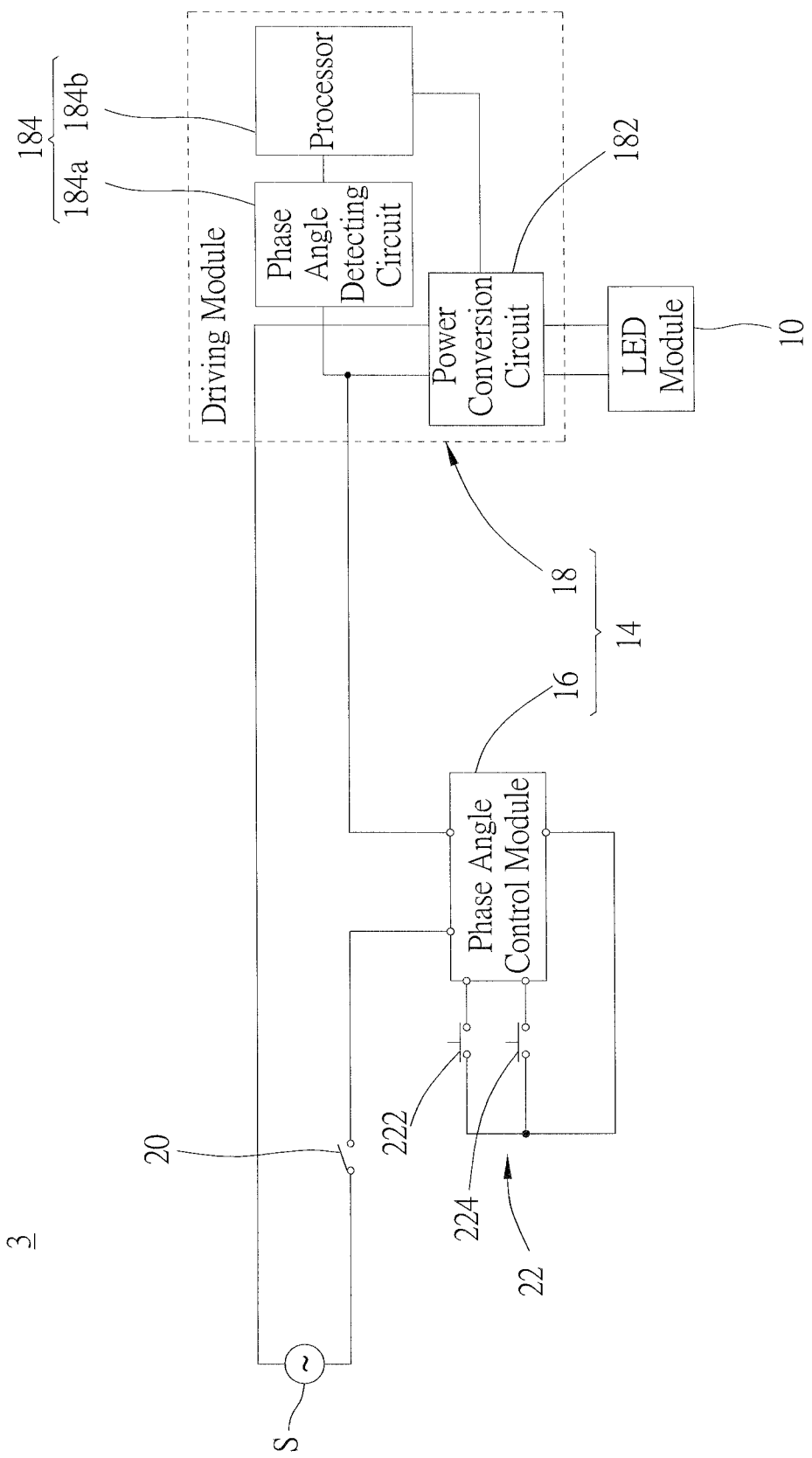
FIG. 3 is a block diagram of the illumination system of a third preferred embodiment of the present invention.

As shown in FIG. 3, a LED illumination system 3 of the third preferred embodiment of the present invention is based on the aforementioned embodiments, but the input interface 22 includes two switches 222, 224, which are electrically connected to the phase angle control module 16. When each switch 222, 224 is pressed and therefore short, the phase angle control module 16 makes the voltage waveform of the AC power S to have the delayed conduction angle in its positive half-wave periods. With different switches 222, 224 being pressed, a degree of the delayed conduction angle is different. Whereby, the phase angle detecting circuit 184*a* can find out which switch 222, 224 is pressed by measuring the degree of the delayed conduction angle, and the processor 184*b* can be switched between the control modes accordingly.

For example, the processor 184*b* is switched between the maximum illumination mode and the default illumination mode by pressing the switch 222 shorter than the predetermined length of time, and it is switched to the luminance adjusting mode by pressing the switch 222 longer than the predetermined length of time.

The processor 184*b* is further built-in with a plurality of default light colors, and each default light color corresponds to one of the luminance ratios of the first and the second LEDs. When the processor 184*b* is under the maximum illumination mode or the default illumination mode, one of the default light colors is selected by shortly pressing the switch 224. The first luminance ratio information or the second luminance ratio information is replaced according to the selected default light color, and the first and the second LEDs are driven to emit light with the newly recorded luminance ratio.

In addition, when the processor 184*b* is under the maximum illumination mode or the default illumination mode, it can be switched to the light color adjusting mode by pressing the switch 224 for a while.

Figure 4:
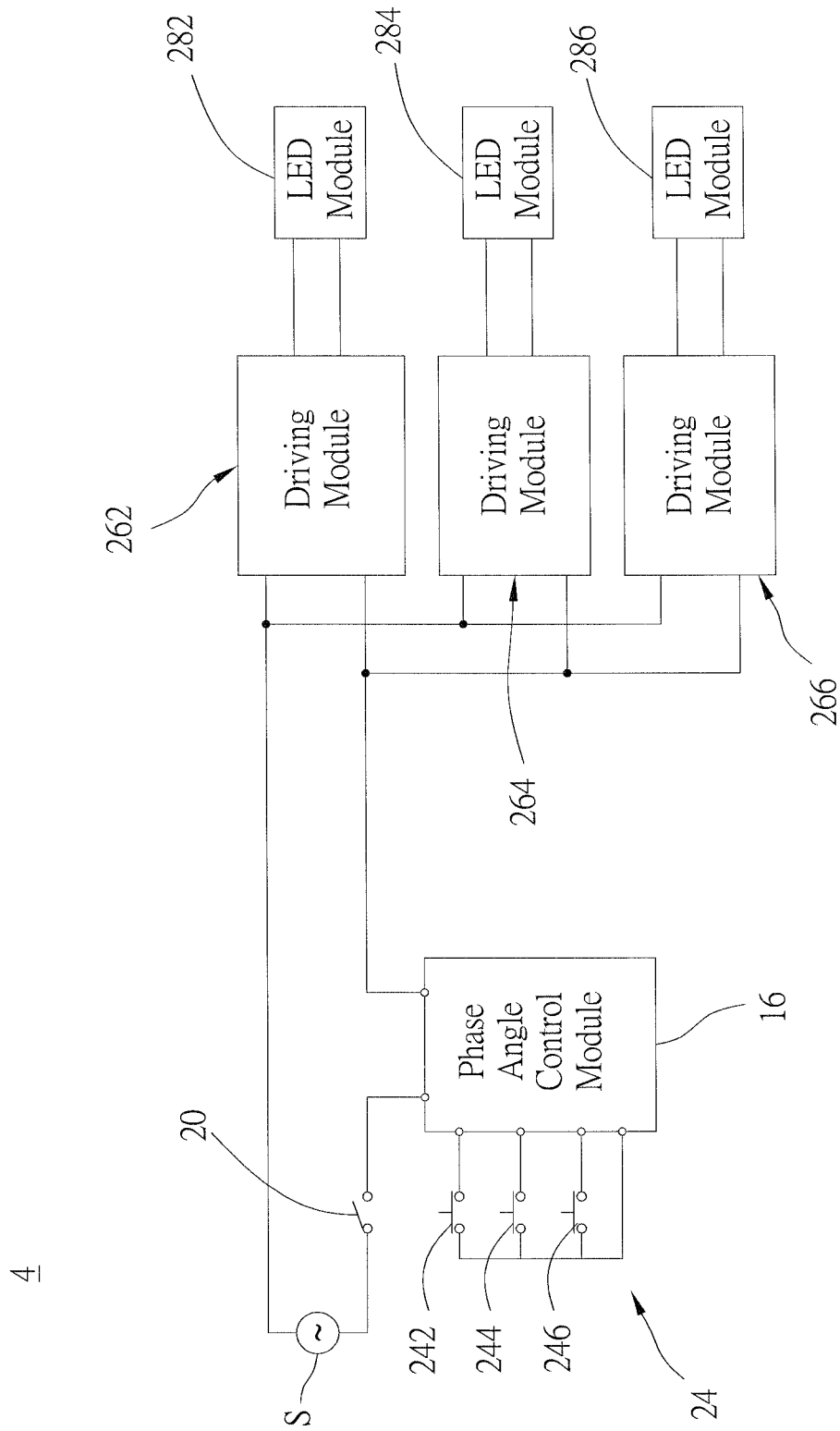
FIG. 4 is a block diagram of the illumination system of a fourth preferred embodiment of the present invention.

As shown in FIG. 4, a LED illumination system 4 of the fourth preferred embodiment of the present invention has roughly the same design with the aforementioned embodiments, except that the input interface 24 includes three switches 242, 244, 246, which are electrically connected to the phase angle control module 16. With different switches 242, 244, 246 being pressed, the phase angle control module 16 makes the angle of the delayed conduction angle different. In addition, the LED illumination system 4 includes three driving modules 262, 264, 266, and three LED modules 282, 284, 286, wherein each driving module 262, 264, 266 corresponds to a specific degree of the delayed conduction angle. In other words, each driving module 262, 264, 266 corresponds to each case that one of the switches 242, 244, 246 is pressed, and each LED module 282, 284, 286 is controlled accordingly.

For example, when the switch 242 is pressed, the driving module 262 measures the correspond degree of the delayed conduction angle and calculates the length of time of the pressing to control the LED module 282.

Of course, there could be more than three switches contained in the input interface 24 in other embodiments. In such cases, there should be driving modules and LED modules with corresponding number provided at the loading end, and the multiple LED modules can still be controlled at the control end.

Figure 5:
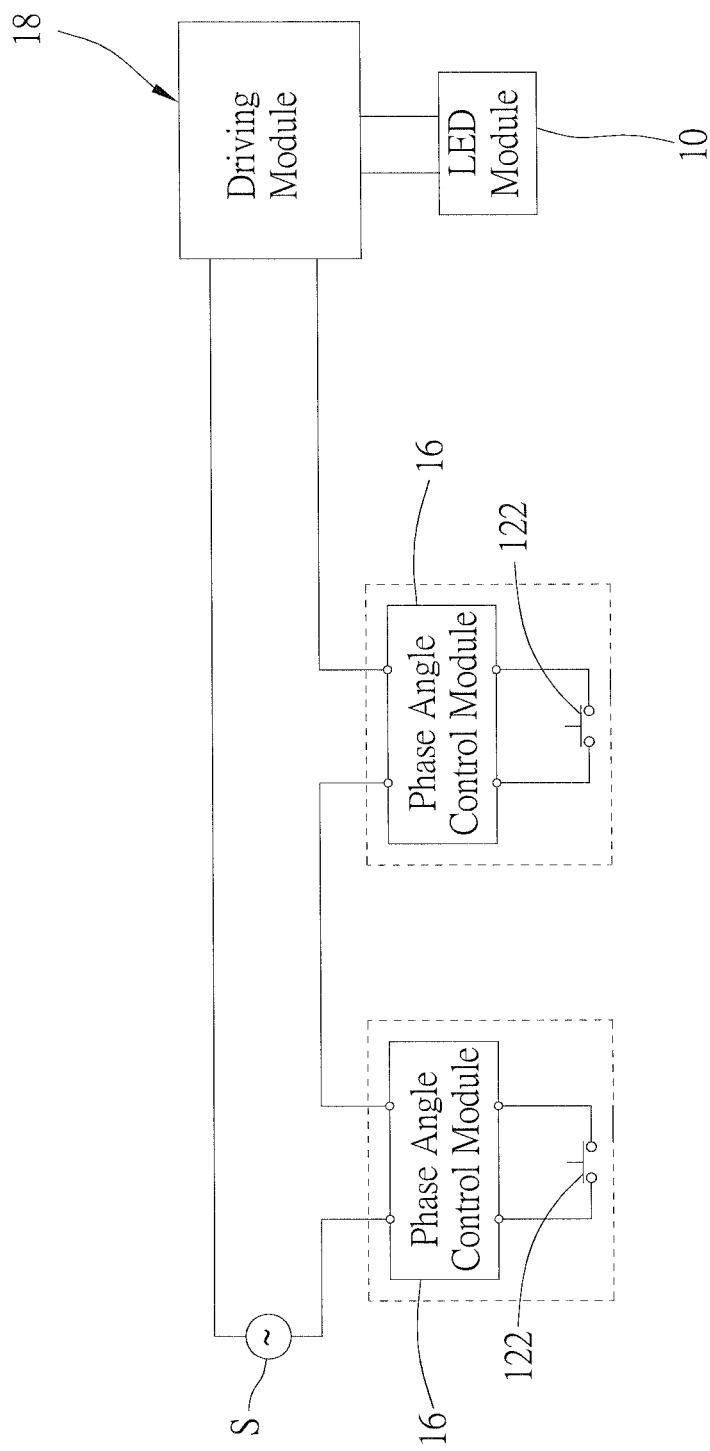
FIG. 5 is a block diagram of the illumination system of a fifth preferred embodiment of the present invention, which is modified from the first preferred embodiment.
Figure 6:
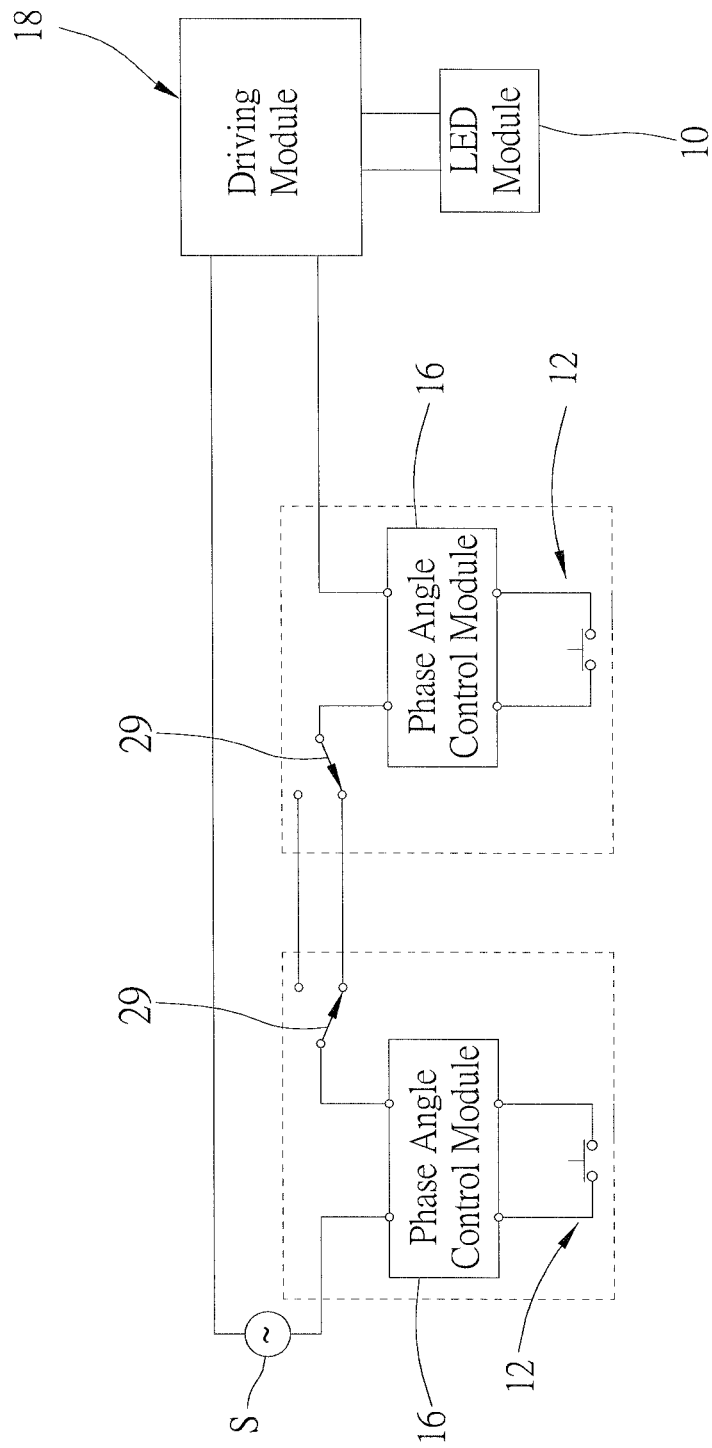
FIG. 6 is a block diagram of the illumination system of a sixth preferred embodiment of the present invention, which is modified from the second preferred embodiment.
Figure 7:
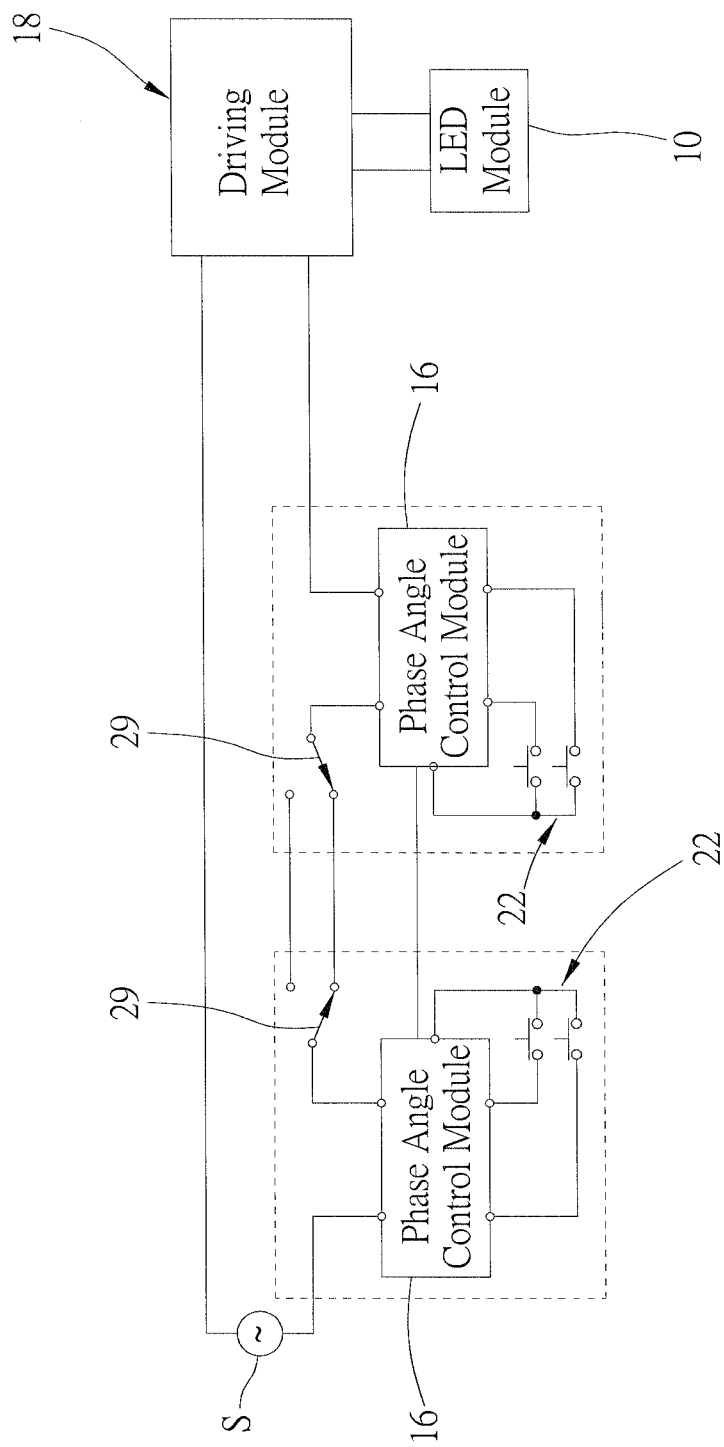
FIG. 7 is a block diagram of the illumination system of a seventh preferred embodiment of the present invention, which is modified from the third preferred embodiment.
Figure 8:
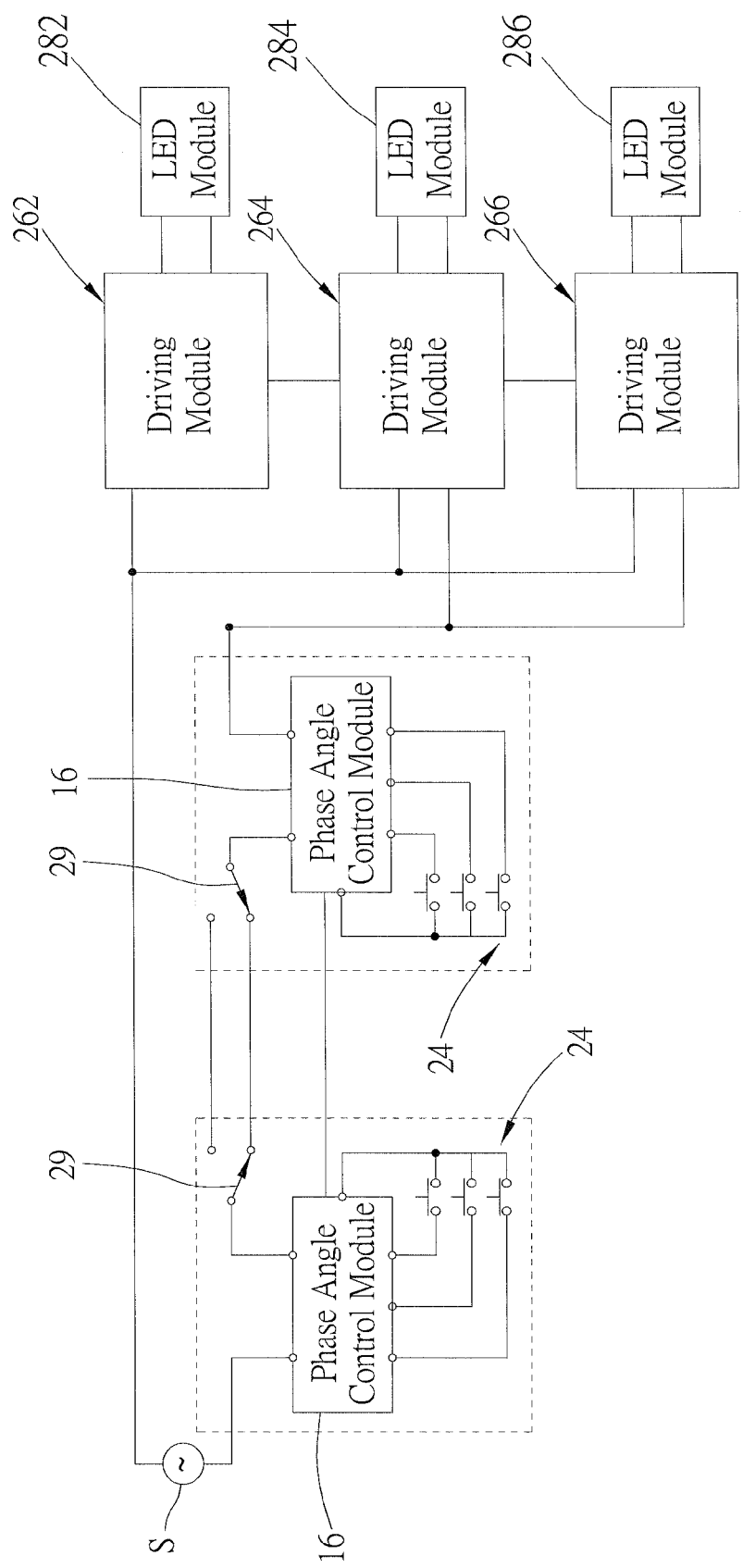
FIG. 8 is a block diagram of the illumination system of an eighth preferred embodiment of the present invention, which is modified from the fourth preferred embodiment.

Besides, in order to fit the pattern of a building, the LED illumination system 1 of the first embodiment can be modified to be the fifth preferred embodiment shown in FIG. 5, wherein there are two phase angle control modules 16 and two switch 122 installed at different locations in the building for the user to control the LED module 10. Based on the same idea, the second, third, and fourth LED illumination system 2, 3, 4 can be modified to be the sixth, seventh, and eighth preferred embodiments respectively shown in FIGS. 6, 7, and 8, wherein there are two three-way switches 29, two phase angle control modules 16, and two input interfaces 12, 22, 24 installed at different locations in the building for the user to control the LED module 10.

Figure 9:
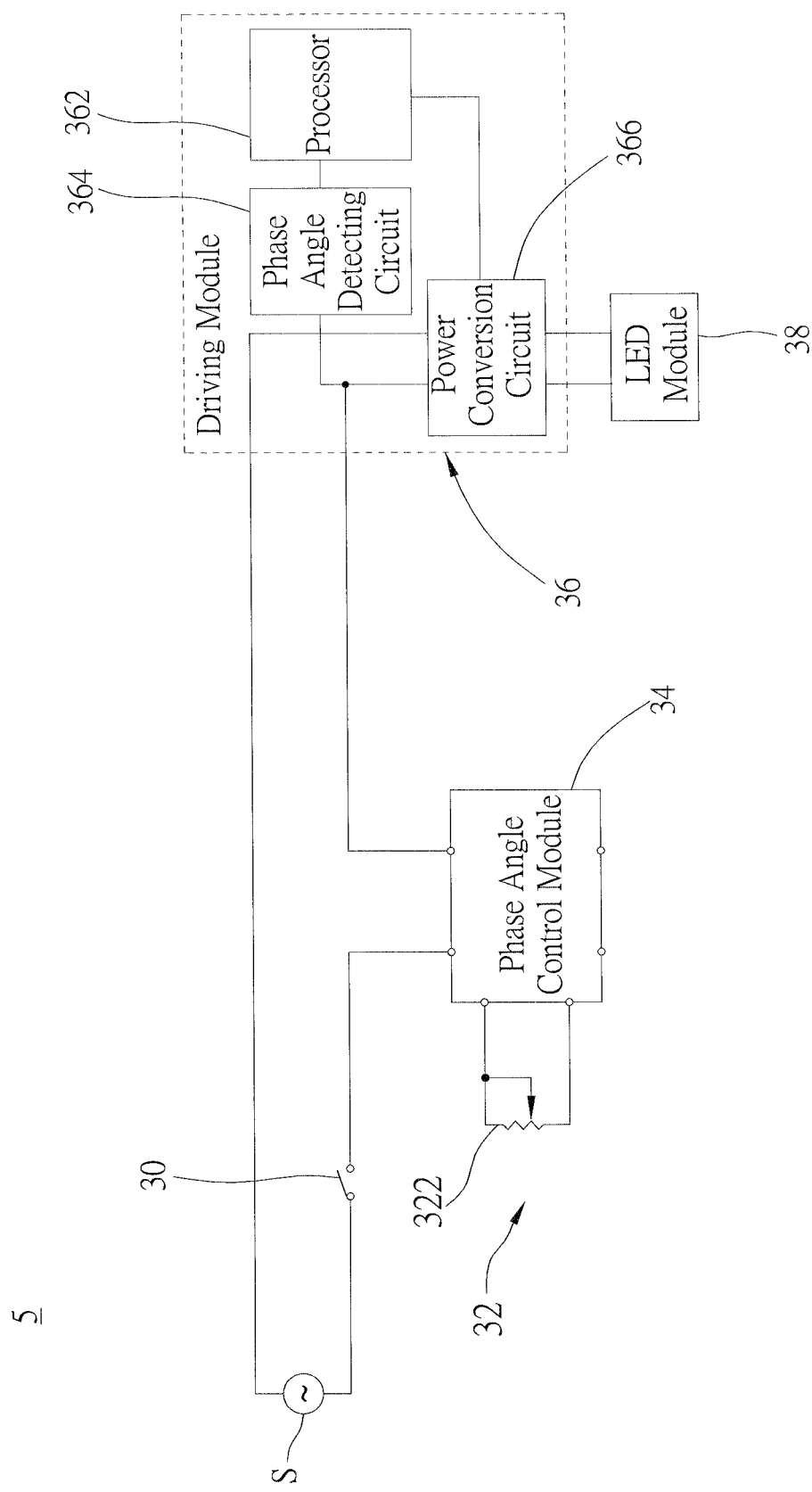
FIG. 9 is a block diagram of the illumination system of a ninth preferred embodiment of the present invention.

As shown in FIG. 9, a LED illumination system 5 of the ninth preferred embodiment of the present invention includes a change-over switch 30, an input interface 32, a phase angle control module 34, a driving module 36, and a LED module 38. The input interface 32 includes an adjustable resistor 322 electrically connected to the phase angle control module 34. With different resistance of the adjustable resistor 322, the degree of the delayed conduction angle is different. In the ninth preferred embodiment, the degree of the delayed conduction angle increases along with the increment of the resistance of the adjustable resistor 322, and the degree of the delayed conduction angle is always greater than zero degree, even when the resistance of the adjustable resistor 322 is adjusted to be zero Ohm. In other words, after the voltage waveform passing through the phase angle control module 34, the delayed conduction angle always exits within.

The processor 362 of the driving module 36 obtains the resistance of the adjustable resistor 322 by measuring the degree of delayed conduction angle with the phase angle detecting circuit 364, and the power conversion circuit 366 transmits the electric signals to the LED module 38 accordingly to the resistance. For example, the luminance or the light color of the LED module 38 can be adjusted with different resistance value.

Each LED illumination system in the aforementioned embodiments is merely an example for explaining the method of transmitting signals of the present invention, and the method can be applied to other loading control systems, such as motor control systems. In such cases, a motor can be controlled by transmitting a status of an input interface at a control end to a loading end through a phase signal transmitter. In addition, other compatible loadings include bathroom heaters, exhaust fans, ceiling fans, or other electric products.

With such design, the method transmits the status of the input interface at the control end to the loading end through the phase signal transmitter, and generates the electric signals corresponding to the status of the input interface to control the loading. In other words, the signals are transmitted by means of the voltage waveform of the AC power, and therefore it is not necessary to install additional wiring or apparatuses for wireless transmission, which effectively reduces the cost of wiring.

It must be pointed out that the embodiments described above are only some preferred embodiments of the present invention. All equivalent structures and methods which employ the concepts disclosed in this specification and the appended claims should fall within the scope of the present invention.

What is claimed is:

1. A method of transmitting signals in a loading control system, wherein the loading control system includes a phase angle control module and a driving module electrically connected to each other; the phase angle control module is electrically connected to an AC power and an input interface, and the driving module is electrically connected to a loading; the method comprising the steps of:
  A. switching the input interface from a first status to a second status;
  B. activating the phase angle control module to modify a voltage waveform of the AC power to make the voltage waveform have a delayed conduction angle in half of its wave periods;
  C. checking the delayed conduction angle of the voltage waveform; and
  D. transmitting an electric signal to the loading from the driving module according to the delayed conduction angle;
  wherein the input interface includes a plurality of switches; the input interface is switched to the second status by activating at least one of the switches, and a degree of the delayed conduction angle is changed by activating different switches; the driving module finds out which switch is activated by measuring the degree of the delayed conduction angle; the electric signal indicates which switch is activated.

2. The method of claim 1, wherein the phase angle control module and the input interface are at a control end; the driving module and the loading are at a loading end.

3. The method of claim 1, wherein the delayed conduction angle is generated at a positive half-wave of the voltage waveform of the AC power.

4. The method of claim 1, wherein the delayed conduction angle is no greater than 90 degrees.

5. The method of claim 1, wherein the step C further comprises transforming an electric power provided by the AC power to another electric power which meets the requirement of the loading.

6. The method of claim 1, wherein the loading is a LED module.

7. A method of transmitting signals in a loading control system, wherein the loading control system includes a phase angle control module and a driving module electrically connected to each other; the phase angle control module is electrically connected to an AC power and an input interface, and the driving module is electrically connected to a loading; the method comprising the steps of:
  A. switching the input interface from a first status to a second status;
  B. activating the phase angle control module to modify a voltage waveform of the AC power to make the voltage waveform have a delayed conduction angle in half of its wave periods;
  C. checking the delayed conduction angle of the voltage waveform; and
  D. transmitting an electric signal to the loading from the driving module according to the delayed conduction angle;
  wherein the input interface includes an adjustable resistor, and a degree of the delayed conduction angle is changed by changing a resistance of the adjustable resistor; the driving module obtains the resistance of the adjustable resistor by measuring the degree of the delayed conduction angle; the electric signal indicates the resistance of the adjustable resistor;
  wherein when the resistance of the adjustable resistor is zero Ohm, the degree of the delayed conduction angle is greater than zero degree.

8. The method of claim 7, wherein the phase angle control module and the input interface are at a control end; the driving module and the loading are at a loading end.

9. The method of claim 7, wherein the delayed conduction angle is generated at a positive half-wave of the voltage waveform of the AC power.

10. The method of claim 7, wherein the delayed conduction angle is no greater than 90 degrees.

11. The method of claim 7, wherein the step C further comprises transforming an electric power provided by the AC power to another electric power which meets the requirement of the loading.

12. The method of claim 7, wherein the loading is a LED module.

13. A method of transmitting signals in a loading control system, wherein the loading control system includes a phase angle control module and a driving module electrically connected to each other; the phase angle control module is electrically connected to an AC power and an input interface, wherein the input interface is in a first status under a normal condition, and the driving module is electrically connected to a loading; the method comprising the steps of:

A. switching the input interface from the first status to a second status to activate the phase angle control module to modify a voltage waveform of the AC power, which makes the voltage waveform have a delayed conduction angle in half of its wave periods;

B. checking whether the delayed conduction angle exists in the voltage waveform or not; and C. transmitting an electric signal to the loading from the driving module if the delayed conduction angle is found in the voltage waveform;

wherein the input interface includes a switch; the input interface is switched to the second status from the first status by activating the switch; when the switch is not activated, the input interface stays in the first status, and the phase angle control module does not modify the voltage waveform;

wherein the driving module finds out that the switch is activated by checking if the delayed conduction angle exits in the voltage waveform of the AC power;

wherein the driving module calculates a length of time for which the switch is pressed by counting the number of the wave periods of the voltage waveform when the delayed conduction angle exists therein in step B, and the electric signal is transmitted to the loading according to the length of time for which the switch is pressed in step C.

14. The method of claim 13, wherein the phase angle control module and the input interface are at a control end; the driving module and the loading are at a loading end.

15. The method of claim 13, wherein the delayed conduction angle is generated at a positive half-wave of the voltage waveform of the AC power.

16. The method of claim 13, wherein the delayed conduction angle is no greater than 90 degrees.

17. The method of claim 13, wherein the step C further comprises transforming an electric power provided by the AC power to another electric power which meets the requirement of the loading.

18. The method of claim 13, wherein the loading is a LED module.

* * * * *